United States Patent [19]

Darley et al.

[11] Patent Number: 4,466,174

[45] Date of Patent: Aug. 21, 1984

[54] METHOD FOR FABRICATING MESFET DEVICE USING A DOUBLE LOCOS PROCESS

[75] Inventors: Henry M. Darley, Plano; Theodore W. Houston, Richardson, both of Tex.

[73] Assignee: Texas Instruments Incorporated, Dallas, Tex.

[21] Appl. No.: 334,948

[22] Filed: Dec. 28, 1981

[51] Int. Cl.³ .......................................... H01L 21/26
[52] U.S. Cl. .................................... 29/571; 29/576 B
[58] Field of Search ............... 29/571, 576 B; 357/22, 357/15

[56] References Cited

U.S. PATENT DOCUMENTS

| | | | |
|---|---|---|---|
| 3,913,211 | 10/1975 | Seeds | 29/571 |
| 4,202,003 | 5/1980 | Darley | 357/15 |
| 4,248,688 | 2/1981 | Gartner | 357/15 |
| 4,253,229 | 3/1981 | Yeh | 427/84 |
| 4,277,882 | 7/1981 | Crossley | 29/571 |
| 4,304,042 | 12/1981 | Yeh | 357/15 |
| 4,309,224 | 1/1982 | Shibata | 29/571 |
| 4,356,040 | 10/1982 | Fu | 29/571 |

OTHER PUBLICATIONS

"Method for Fabricating a Self-Aligned Vertical PNP Transistor", Isaac et al., *IBM Technical Disclosure Bulletin*, vol. 22, No. 8A, Jan. 1980, pp. 3203-3206.

*Primary Examiner*—L. Dewayne Rutledge
*Assistant Examiner*—J. J. Zimmerman
*Attorney, Agent, or Firm*—Gary Honeycutt; Rich Donaldson; Mel Sharp

[57] ABSTRACT

MESFET devices are fabricated on a semiconductor substrate using a LOCOS (localized oxidation of silicon) process twice during the fabrication. The first LOCOS process provides device separation with a self-aligned thick-field oxide (SATO). The second LOCOS provides separation of gate and source/drain regions for each device, and self-aligns the gate contact with the channel implant. Devices fabricated by this method exhibit reduced series resistance, and improved metal step coverage.

8 Claims, 6 Drawing Figures

METHOD FOR FABRICATING MESFET DEVICE USING A DOUBLE LOCOS PROCESS

BACKGROUND OF THE INVENTION

This invention relates to methods for making semiconductor devices, and more particularly to methods for making a MESFET.

The history of integrated circuit design has been characterized by a trend to increasing circuit densities. Various technologies have been developed to stimulate this trend. For example, TTL (transistor-transistor logic) was standard in digital equipment for a long time, but has given way in many areas to N-channel MOS logic circuits because of their superiority in speed-power product, packing density, and ease of device fabrication. The MESFET is a device that offers many of the advantages of N-MOS technology witout some of its disadvantages. Its application and microprocessor circuits will be primarily in digital logic such as memory and microprocessor circuits, as was the transistor of TTL.

One of the problems with N-channel MOS devices is that when they are scaled down in size, the gate oxide thickness must be scaled down accordingly. This creates a problem in that it is very difficult to fabricate thin silicon oxides that are free from "pinholes". A "pinhole" in a gate oxide will create a gate-to-channel short and, therefore, a device failure. This problem can be very serious, as there can be thousands of gate oxide areas on a typical N-channel MOS memory or microprocessor.

In U.S. Pat. No. 4,202,003, Darley et al disclose a MESFET device which solves many of the problems with N-channel MOS integrated circuits. However, with the continuing trend to higher packing densities, the device disclosed in the aforementioned patent will not be suitable for future design needs. Alignment tolerances which restrict chip size must be allowed for in device design, as they also adversely affect device performance by increasing source-to-drain series resistance.

It is a principal object of this invention to provide an improved method for making a MESFET device which is useful in the design of high density digital logic circuits. Another object is to provide a more compact MESFET device, with low source-to-drain series resistance.

SUMMARY OF THE INVENTION

In accordance with the present invention, there is provided a method for fabricating a MESFET device using the local oxidation of silicon (LOCOS) process. The method uses the LOCOS process in two steps of the fabrication, and produces an improved device having reduced series channel resistance, and improved metal step coverage.

The fabrication method begins with a substrate of silicon, lightly doped p type. On the substrate is grown a layer of oxide, and then a layer of silicon nitride ($Si_3N_4$) is deposited. A layer of photoresist is then deposited and patterned. The structure is etched to remove the silicon nitride where not covered by photoresist. The areas where the nitride is removed are implanted with a p type material. This implant provides device separation by preventing surface inversion and subsequent shorting between devices.

Next, an oxidation is performed to grow a thick field oxide on either side of the silicon nitride pad. The source and drain regions are then defined in the silicon nitride by a layer of patterned photoresist. After etching to remove the unprotected silicon nitride and optional removal of the oxide, a heavy dose of n-type dopant is implanted to create the source and drain regions of the device.

As noted, removal of the oxide is optional, and if it is removed, a thin layer of oxide must be grown or deposited on the substrate prior to subsequent steps. Next, a layer of silicon nitride is deposited and patterned to define the gate, and channel regions of the device. An implant is now done through the oxide in the unpatterned areas. This implant determines the series resistance of the device, and should be significantly greater than the subsequent channel implant. However, the implant should not be heavy enough to cause ohmic contact with the contact material. The structure is then thermally oxidized to form oxide partitions for the gate, source and drain contacts. After the oxidation, the nitride is stripped. The remaining thin oxide which was underneath the nitride can be removed now, or after the channel implant. At this point, the channel implant is done. The device is now complete, except for contacts. For contacts, a metal which forms silicide and Schottky barrier, for example, platinum, is deposited on the device surface, and the device subjected to a sintering process. In the areas where the metal is in contact with the silicon substrate, silicide forms in the sintering process. For those areas where the metal contacts oxide, no reaction takes place, and the metal is easily removed. A layer of metal is deposited and then patterned to form the interconnections between individual devices on a chip.

The advantages of the device produced by this process and the details thereof will be more clear when referring to the accompanying description and drawings.

DETAILED DESCRIPTION OF THE DRAWINGS

Figure 1:
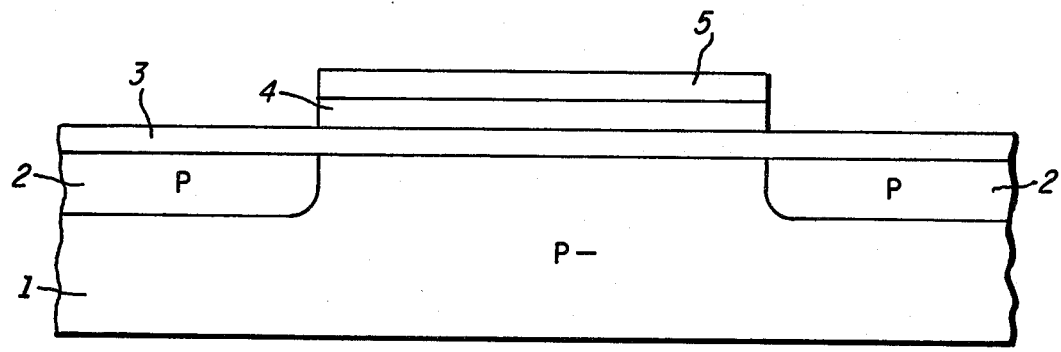
FIG. 1 is a cross-sectional view of a silicon substrate having a layer of oxide and a nitride pad defining the device area, and having implanted areas for device isolation.

Referring now to FIG. 1, the preferred embodiment of the present invention is fabricated on a lightly doped P-type monocrystalline silicon substrate 1 having a relatively high resistivity of greater than 10 ohms per centimeter. On the substrate is grown a layer of oxide 3, 500 to 1000 Å in thickness. Then, a layer of silicon nitride 4, 1500 Å in thickness is deposited. On the nitride is deposited a patterned layer of photoresist 5. The structure is etched to remove the unprotected nitride, and after the etch, an implant of a N-type dopant is done to provide device isolation areas 2. At this point, the structure is as shown in FIG. 1.

Figure 2:
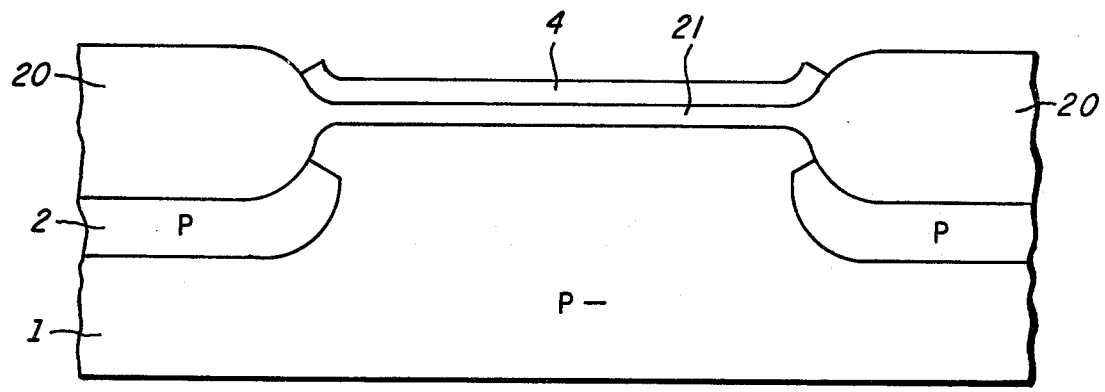
FIG. 2 is a cross sectional view showing the structure of FIG. 1 after having been subjected to a first LOCOS process.
Figure 3:
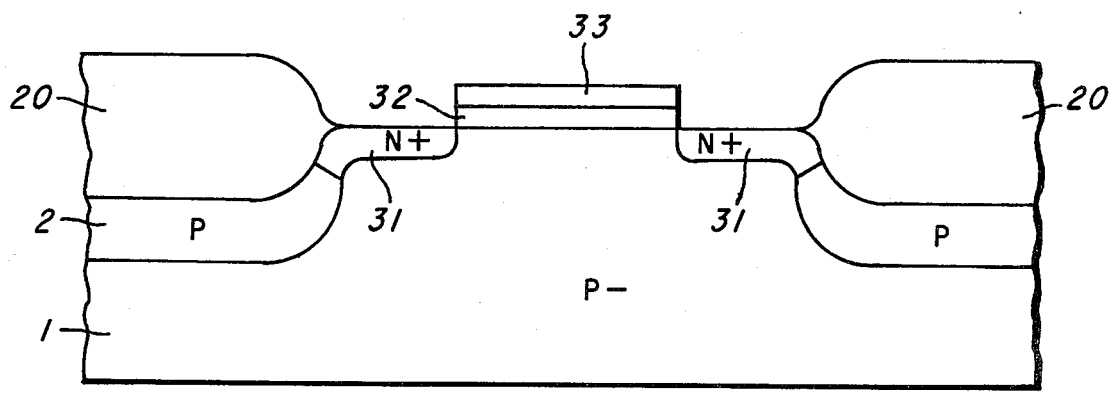
FIG. 3 shows a cross sectional view of the device after source and drain region implants.
Figure 4:
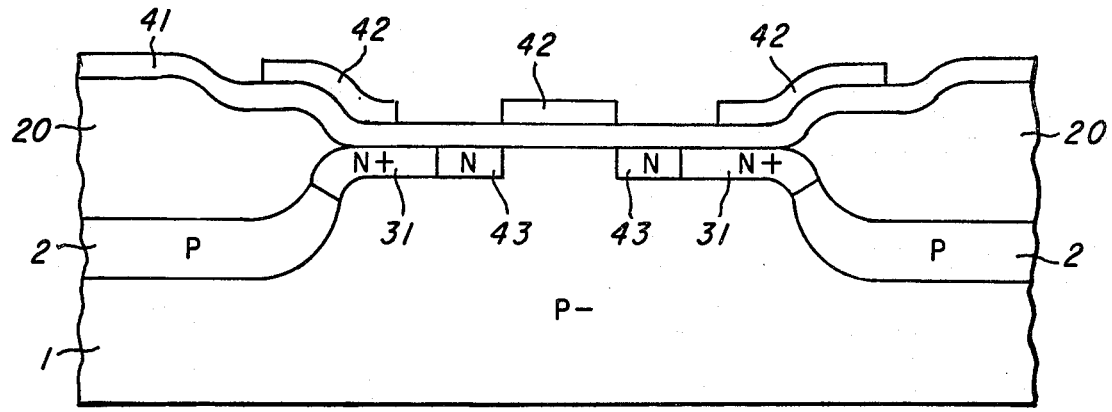
FIG. 4 shows a cross-sectional view of the device after nitride masking of device contact areas, and implant for device channel connection areas.

The next step in the method of the present invention is a thermal oxidation of the structure. This thermal oxidation consists of subjecting the structure to a steam ambient environment at 950° C. for 260 minutes. The resulting local oxidation of silicon (LOCOS) causes the structure to be formed as shown in FIG. 2. The areas of silicon oxide 20 not protected by silicon nitride 4 grow significantly, while the area of silicon oxide 21 protected by the nitride is relatively unchanged. After the oxidation, the source and drain regions are defined on the nitride pad, and the structure etched to remove the protection from the source and drain areas. In an alternative to this step, the nitride is completely removed, then a nitride layer deposited and patterned. The structure is now as is shown in FIG. 3, with the remaining nitride 33 over the oxide 32, protecting the gate region. An implant of a heavy dose of N-type dopant, such as arsenic, at a $1 \times 10^{16}$ dosage and 80 KeV energy level, is done, converting the source and drain areas 31 to N+ conductivity. The nitride and oxide are now removed, and then a new layer of oxide is grown or deposited. A layer of silicon nitride is deposited and patterned over the oxide, and the structure has a cross section as shown in FIG. 4. The oxide 41 has the patterned silicon nitride 42 over the source gate and drain regions for protection during an implant of n-type dopant to form extension regions 43 in the substrate 1. This implant, for example, arsenic, at a dosage of $8 \times 10^{13}$ and an energy level of 80 KeV, is heavier than the channel implant for the gate region, which is yet to come, but not heavy enough to cause ohmic contact with the yet to be deposited contact material. This implant determines the series resistance of the device channel.

Figure 5:
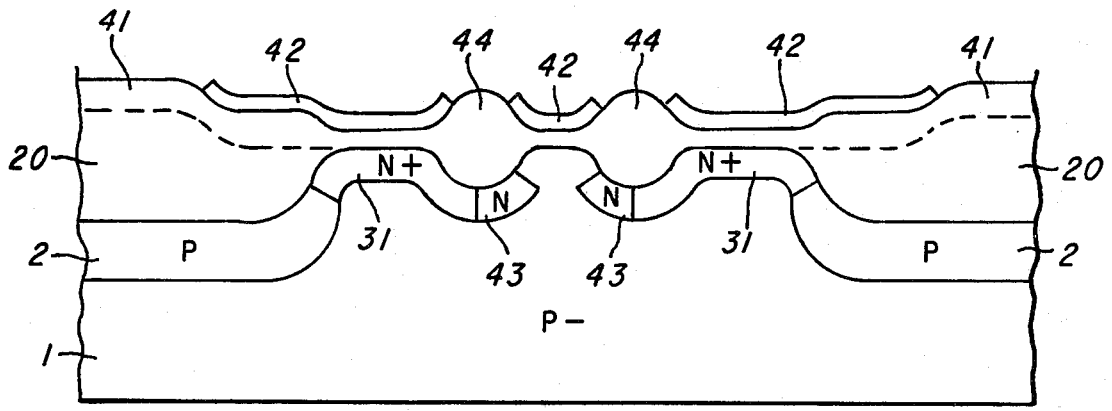
FIG. 5 shows a cross-sectional view of the structure after the second LOCOS process.
Figure 6:
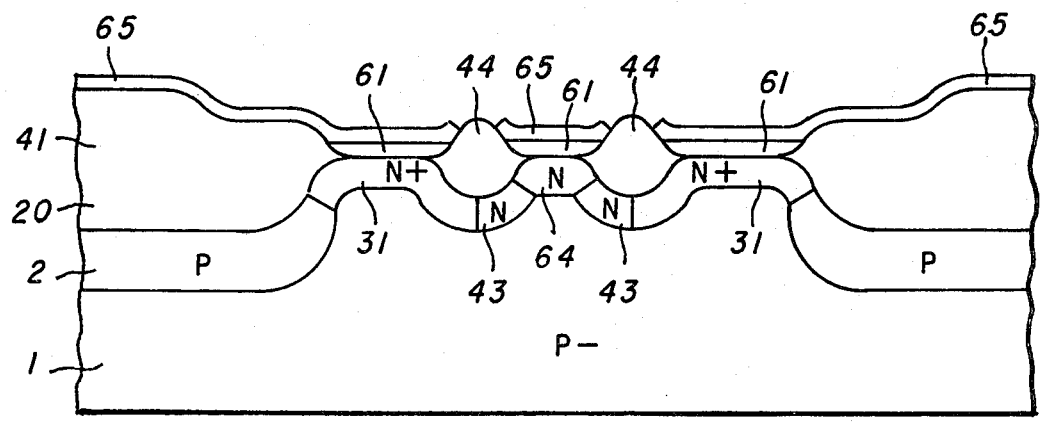
FIG. 6 shows a cross-sectional view of the finished device.

After the implant, the structure is subjected to a second LOCOS process. This oxidation consists of subjecting the structure to a steam ambient environment of 900° C. for 120 minutes. After this, the structure is shaped as in FIG. 5. The unprotected areas of oxide 44 grow to form partitions between the gate-source regions and the gate-drain regions. The silicon nitride is now removed, and also the thin oxide over the source gate and drain regions. The gate region channel implant is done at this point, and this completes the device channel.

Next, a layer of metal which will form silicide and a Schottky barrier, for example, platinum, is deposited over the device area, 300 Å thick, and the structure sintered. The metal in contact with the silicon substrate 1 reacts with it to form silicide 61. The metal in contact with oxide does not react, and is removed. A metal interconnect layer 65 is then deposited and patterned to make the desired connections, thus completing the device.

Devices fabricated with the method of the present invention have a number of advantages compared to previous methods of fabrication. First, the series resistance of the device channel is reduced. This means better device performance, reliability, and longer life. Second, step coverage of metal interconnects is improved and this improves yields for circuits employing devices made in this way. Third, critical threshold implant is made through the same opening as the gate contact will be located in, thus self-aligning the gate channel to its contact. Also, the method is simplified by not requiring an undercutting etch step.

We claim:

1. A method for fabrication of MESFET devices, comprising the steps of:
   providing a silicon substrate;
   forming thick field oxide on predetermined areas of said substrate, to isolate a plurality of device areas in predetermined areas of said substrate;
   doping a plurality of source and drain regions within said device areas, with a heavy dose of a first-conductivity-type impurity;
   providing a patterned masking material over said source and drain regions, and also over a plurality of gate regions in predetermined locations within said device areas;
   introducing a first-type dopant into exposed portions of said substrate to form extension regions;
   locally oxidizing exposed portions of said substrate;
   removing said patterned masking material;
   implanting a N type dopant in the substrate in the region defined by the locally oxidized portions to form the device channel; and
   depositing a metal overall, and heating said metal to form silicides where said meal is in contact with silicon, whereby said silicides provide Schottky-barrier contact to said gate regions, and ohmic contact to said source and drain regions, thereby defining a plurality of MESFET devices.

2. The method of claim 1, wherein said substrate comprises a small concentration of a second-conductivity-type impurity.

3. The method of claim 2, further comprising the step of:
   introducing a second-type dopant into said substrate outside of said device areas, whereby channel stop regions are formed beneath said thick field oxide.

4. The method of claim 1, further comprising the step of:
   after said patterned masking material has been removed, introducing a dopant into areas which had been covered by said patterned marking material, whereby the respective threshold voltages of said MESFETs are altered.

5. A method for fabrication of MESFET devices, comprising the steps of:
   forming a first insulator layer on a silicon substrate;
   forming a second insulator layer on said first layer;
   patterning to define device areas in said second insulator layer;
   introducing a p-type dopant into the substrate through said first insulator layer, then removing remaining photoresist;
   thermally oxidizing the substrate to provide a patterned thick field oxide;
   patterning said second insulator layer;
   implanting n-type dopant in said substrate to create source and drain regions of the device being fabricated;
   removing the remainder of said second insulator layer and forming a patterned third layer of insulator over said first insulator layer;
   introducing n-type dopant in said substrate to determine device series resistance;
   thermally oxidizing to create oxide partitions between source, gate, and drain areas of said device;
   removing said third insulator layer;

implanting an n-type dopant in the substrate under the device gate region to form the device channel;

removing the remainder of said first insulator layer;

depositing a layer or metal over the device area, and sintering to form metal silicide over areas where metal is in contact with substrate and did not form silicide;

forming a patterned layer of metal to form device contacts and interconnections between devices.

6. A method as in claim 5, wherein said first insulator layer is silicon oxide.

7. A method as in claim 5, wherein said second insulator layer is silicon nitride.

8. A method as in claim 5, wherein said third insulator layer in silicon nitride.

* * * * *